(12) United States Patent
Kajino et al.

(10) Patent No.: US 8,206,548 B2
(45) Date of Patent: Jun. 26, 2012

(54) SUBSTRATE PROCESSING APPARATUS AND SUBSTRATE PROCESSING METHOD

(75) Inventors: Itsuki Kajino, Kyoto (JP); Akihiro Hosokawa, Kyoto (JP); Kozo Terashima, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1170 days.

(21) Appl. No.: 12/030,494

(22) Filed: Feb. 13, 2008

(65) Prior Publication Data

US 2008/0237188 A1 Oct. 2, 2008

(30) Foreign Application Priority Data

Mar. 29, 2007 (JP) ................................. 2007-087374

(51) Int. Cl.
*C23F 1/00* (2006.01)
*C23F 1/08* (2006.01)
(52) U.S. Cl. .................. 156/345.18; 216/83; 134/104.2
(58) Field of Classification Search ................. 216/93, 216/83; 134/56 R, 18, 103.1, 104.2, 902; 156/345.15, 345.18
See application file for complete search history.

(56) References Cited

U.S. PATENT DOCUMENTS

| 5,317,778 | A | 6/1994 | Kudo et al. | |
| 5,547,515 | A | 8/1996 | Kudo et al. | |
| 2003/0079835 | A1* | 5/2003 | Kajino et al. | 156/345.11 |
| 2007/0144563 | A1 | 6/2007 | Araki | |
| 2008/0237188 | A1* | 10/2008 | Kajino et al. | 216/93 |

FOREIGN PATENT DOCUMENTS

| JP | 3-124028 | 5/1991 |
| JP | 5-57271 | 3/1993 |
| JP | 5-190442 | 7/1993 |
| JP | 2767165 | 6/1998 |
| JP | 10-321577 | 12/1998 |
| JP | 11-121415 | 4/1999 |
| JP | 2984006 | 9/1999 |
| JP | 2000-286224 | 10/2000 |
| JP | 2002-329705 | 11/2002 |
| JP | 2003-218004 | 7/2003 |
| JP | 3481433 | 12/2003 |
| JP | 2007-180426 | 7/2007 |

OTHER PUBLICATIONS

Notification of Reasons for Refusal mailed on Jun. 28, 2011 in connection with corresponding Japanese Patent Application No. 2007-087374.

* cited by examiner

*Primary Examiner* — Sylvia MacArthur
(74) *Attorney, Agent, or Firm* — Ostrolenk Faber LLP

(57) ABSTRACT

Mutually different plural kinds of processing liquid are sequentially supplied to a gap space in which a substrate is arranged to perform a wet processing to the substrate with respect to each processing liquid. Further, the processing liquid used in the wet processing is sequentially released from the communicating portion upon execution of each wet processing. The liquid retrieval tanks are selectively positioned at a retrieval position corresponding to the kind of processing liquid released from the communicating portion by relatively moving the processing unit and the liquid retrieval unit. The liquid retrieval unit is separated from the processing unit and is arranged below the processing unit. The processing liquid is released from the communicating portion of the processing unit to below the gap space downwards vertically.

12 Claims, 10 Drawing Sheets

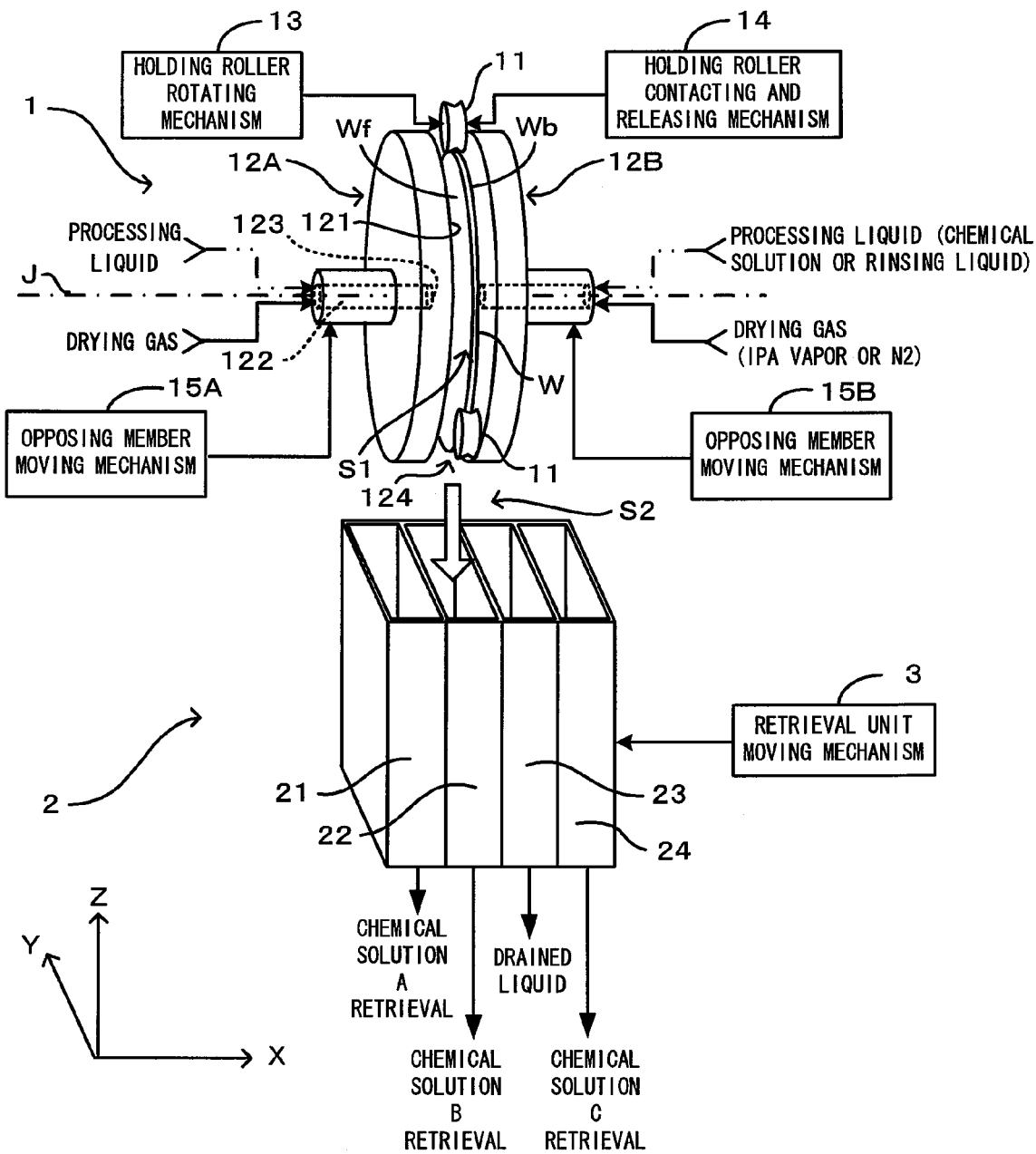
F I G. 1

F I G. 3
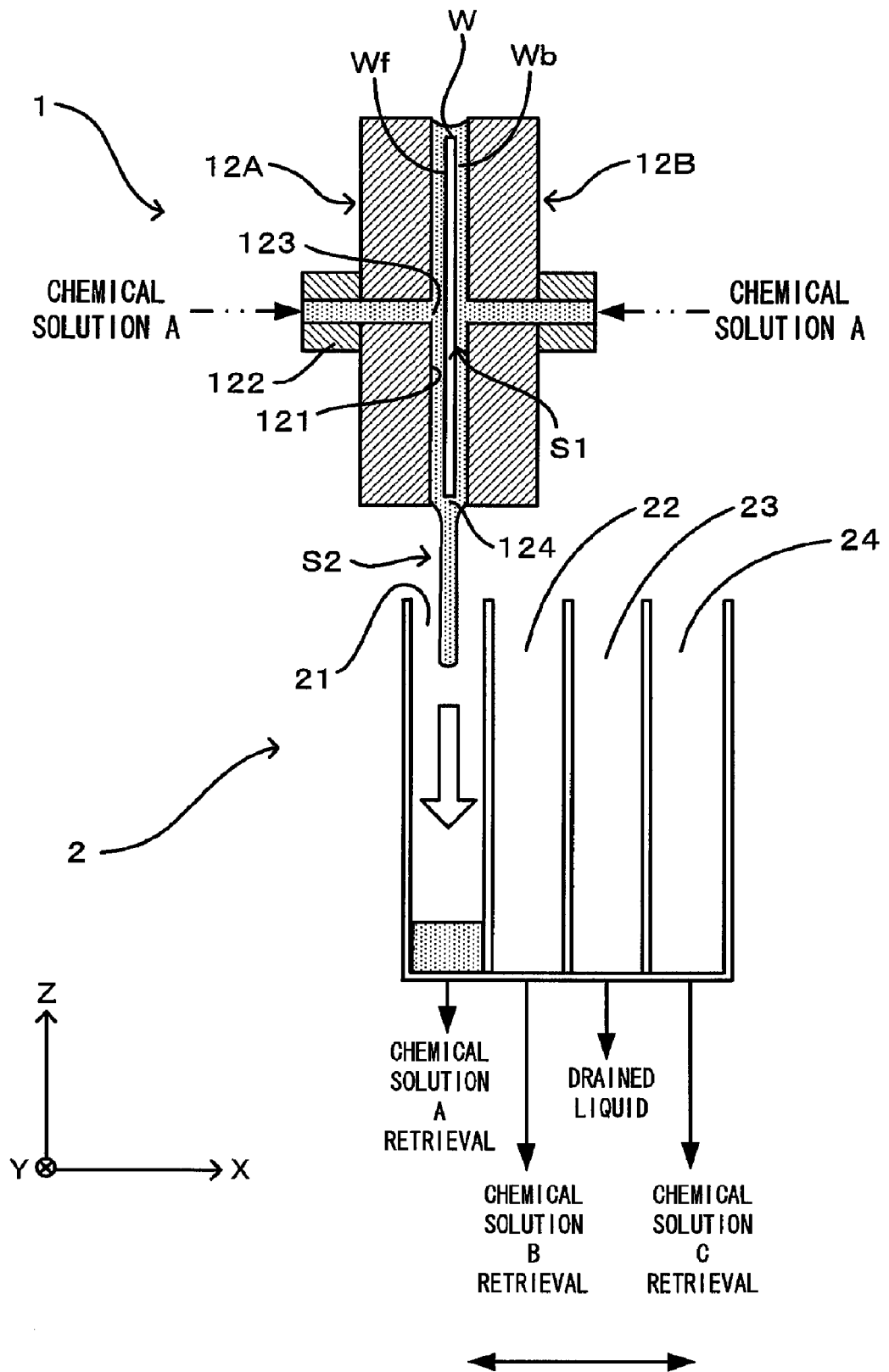

F I G. 1 1
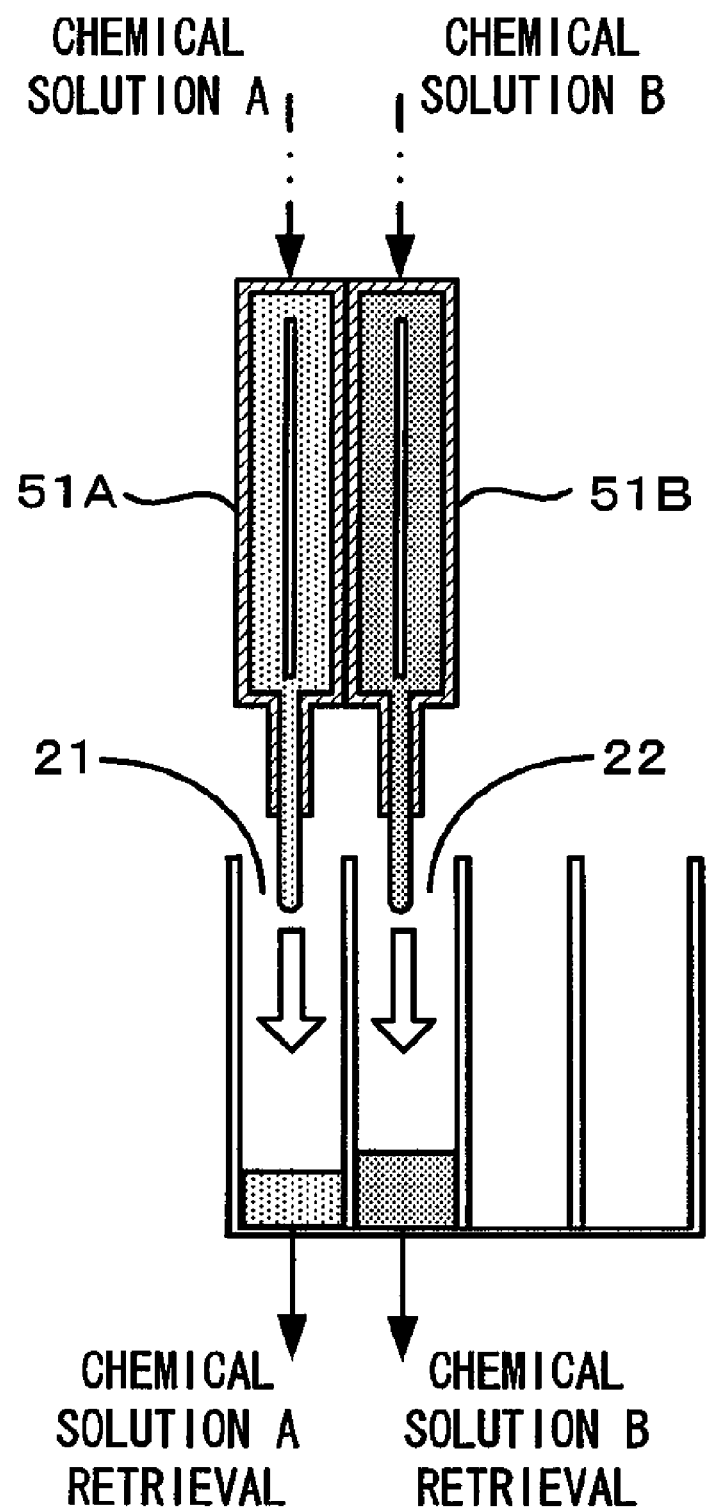

SUBSTRATE PROCESSING APPARATUS AND SUBSTRATE PROCESSING METHOD

CROSS REFERENCE TO RELATED APPLICATION

The disclosure of Japanese Patent Application No. 2007-87374 filed Mar. 29, 2007 including specification, drawings and claims is incorporated herein by reference in its entirety.

BACKGROUND OF THE INVENTION

1. Field of the Invention

The present invention relates to a substrate processing apparatus and a substrate processing method which supply a processing liquid to a substrate to perform a predetermined wet processing to the substrate, the substrate including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

2. Description of the Related Art

In a production process of electronic components such as semiconductor devices and liquid crystal display devices, a predetermined wet processing is performed to the substrates by sequentially supplying plural kinds of processing liquid such as chemical solution and rinsing solution to the substrates. In a substrate processing apparatus of a single wafer processing type which processes a substrate one by one, plural kinds of processing liquid are sequentially supplied to the substrate while the substrate is rotated in a horizontal posture to perform a wet processing to the substrate with respect to each processing liquid. In order to enable reuse of the chemical solution as well as preventing dispersion of the processing liquid shaken off from the substrate, the processing liquids which are shaken off from the substrate are separately retrieved with respect to each kind of processing liquid (see JP-A-5-190442). In the apparatus described in JP-A-5-190442, a first and a second cups are provided so as to surround a spin chuck which holds and rotates the substrate in a horizontal posture. And a first chemical solution shaken off from the rotating substrate is received by the first cup for retrieval, whereas a second chemical solution shaken off from the rotating substrate is received by the second cup for retrieval. Specifically, it is possible to retrieve mutually different chemical solutions (the first and the second chemical solutions) separately by means of the first and the second cups.

In a substrate processing apparatus of a batch processing type which processes plural substrates collectively, the wet processing is performed to the plural substrates by immersing the plural substrates in a processing liquid stored in a processing tank. There is a case that the wet processing is performed to a substrate with respect to each processing solution by sequentially replacing a processing liquid stored in the processing tank with mutually different plural kinds of processing liquid (see JP-A-2000-286224). In the apparatus described in JP-A-2000-286224, it is arranged that the processing liquids discharged from the processing tank are separately retrieved with respect to each kind of processing liquid. Specifically, the processing liquid overflowed from the processing tank is guided to respective destinations according to kinds of the processing liquid via branch pipes branched from a single pipe to a number of kinds of the processing liquid. Each branch pipe is equipped with an on-off valve. The destination of the processing liquid overflowed from the processing tank is switched by controlling opening and closing of the respective on-off valves. Consequently, the processing liquids are sent to the respective destinations according to the kinds of the processing liquid to separately retrieve the processing liquid. That is, when a first chemical solution is discharged from the processing tank, only the on-off valve mounted on the branch pipe for the first chemical solution is opened while the on-off valves mounted on the other branch pipes are closed to retrieve the first chemical solution. Further, when a second chemical solution is discharged from the processing tank, only the on-off valve mounted on the branch pipe for the second chemical solution is opened while the on-off valves mounted on the other branch pipes are closed to retrieve the second chemical solution.

SUMMARY OF THE INVENTION

Incidentally, in the apparatus described in JP-A-5-190442, the processing liquid flown out of the substrate sometimes turns into droplets and those droplets of the processing liquid disperse in an unintended direction. As a result, there have been incidents that droplets of the first chemical solution get into the second cup for retrieving the second chemical solution to get the first chemical solution mixed into the second chemical solution, and that the second chemical solution get into the first cup for retrieving the first chemical solution to get the second chemical solution mixed into the first chemical solution. In the event that different kind of chemical solution is mixed into the chemical solution to be retrieved, reuse of the chemical solution is interfered with, resulting in a decrease of the retrieval rate of the chemical solution.

Further, in the apparatus described in the JP-A-5-190442, the dispersion of the processing liquid during the wet processing causes mist of the processing liquid to stay afloat within the cup. For example, when the chemical processing is performed with the first chemical solution, it becomes an atmosphere of the first chemical solution inside the cup. Such an atmosphere of the first chemical solution negatively affects the substrate during the chemical processing with the second chemical solution or the rinsing processing with the rinsing liquid which are to be performed afterward within the same apparatus. Therefore, emission of the atmosphere is usually performed in order to clean the atmosphere around the substrate. However, in the case where such an emission is performed, there sometimes have been incidents that the chemical solution to be retrieved is drawn into the emission and does not get into the cup, or that the chemical solution is retrieved in a cup for other kinds of the chemical solution affected by the emission.

Further, in the apparatus described in JP-A-2000-286224, drained liquid discharged from the processing tank is separately retrieved by switching the destination of the drained liquid by means of the on-off valves mounted on the respective branch pipes. Therefore, in the case where the second chemical solution is retrieved via the branch pipe for the second chemical solution after the first chemical solution is retrieved via the branch pipe for the first chemical solution, following problems sometimes occurred. That is, if the first chemical solution remains within the pipe at the upstream side (processing tank side) of the on-off valve mounted on the branch pipe for the first chemical solution, not only the retrieval rate of the first chemical solution decreases, but also the first chemical solution is mixed into the second chemical solution upon retrieving the second chemical solution via the branch pipe for the second chemical solution. Hence, the reuse of the second solution is disturbed and the retrieval rate of the second solution is decreased.

The invention has been made in light of the problem described above, and accordingly an object of the invention is to provide a substrate processing apparatus and a substrate processing method which can separately retrieve plural kinds of processing liquid preferably upon performing a predetermined wet processing to the substrate by supplying mutually different plural kinds of processing liquid sequentially to the substrate.

According to a first aspect of the invention, there is provided a substrate processing apparatus, comprising: a processing unit that includes a processing space in which a substrate is arranged, sequentially supplies mutually different plural kinds of processing liquid to the processing space to perform a predetermined wet processing to the substrate with respect to each processing liquid, releases the processing liquid used in the wet processing from a releasing portion downwards of the processing space in a predetermined direction upon each execution of the wet processing; a liquid retrieval unit that includes plural liquid retrievers, is separated from the processing unit, and is disposed below the processing unit, the plural liquid retrievers retrieving the plural kinds of processing liquid sequentially released from the releasing portion at each retrieval position predetermined with respect to each kind of the processing liquid; and a selectively positioning unit that relatively moves the processing unit and the liquid retrieval unit to selectively position each of the liquid retrievers at each retrieval position corresponding to the kind of the processing liquid released from the releasing portion.

According to a second aspect of the invention, there is provided a substrate processing method comprising the steps of: arranging a substrate in a processing space provided in a processing unit; sequentially supplying mutually different plural kinds of processing liquid to the processing space to perform a predetermined wet processing to the substrate with respect to each processing liquid; releasing the processing liquid used in the wet processing from a releasing portion provided in the processing unit downwards of the processing space in a predetermined direction upon each execution of the wet processing; relatively moving the processing unit and a liquid retrieval unit that includes plural liquid retrievers, is separated from the processing unit, and is arranged below the processing unit to selectively position each of the liquid retrievers at a predetermined retrieval position corresponding to the kind of the processing liquid released from the releasing portion, wherein each of the plural liquid retrievers retrieves each of the plural kinds of processing liquid released sequentially from the releasing portion at each retrieval position with respect to each kind of the processing liquid.

According to the invention, the liquid retrieval unit is separated from the processing unit and is disposed below the processing unit. The processing liquid is released from the releasing portion downwards of the processing space in a predetermined direction. Consequently, the destination of the released processing liquid is limited to the predetermined direction downwards of the processing space. Hence, the processing liquid is prevented from dispersing in an unintended direction. This ensures the processing liquid released from the releasing portion to be retrieved in the liquid retriever without fail. Further, the processing liquid released from the releasing portion is thus retrieved at the retrieval position corresponding to the kind of the processing liquid. Hence, it is possible to securely separate to retrieve the plural kinds of the processing liquid. Furthermore, the processing liquid released from the releasing portion is retrieved directly in the liquid retrieval unit without going through pipes and the like. Hence, it is possible to prevent the processing liquid from remaining in the pipes, to prevent the decrease of the retrieval rate of the processing liquid, and to prevent other kinds of processing liquid from mixing into the retrieved processing liquid.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a diagram showing a first embodiment of a substrate processing apparatus according to the invention.

FIG. 3 is a diagram showing a situation when the chemical solution is supplied to the gap space.

FIGS. 9 to 11 are diagrams showing modifications of the substrate processing apparatus according to the invention.

DETAILED DESCRIPTION OF THE PREFERRED EMBODIMENTS

<First Embodiment>

Figure 2:
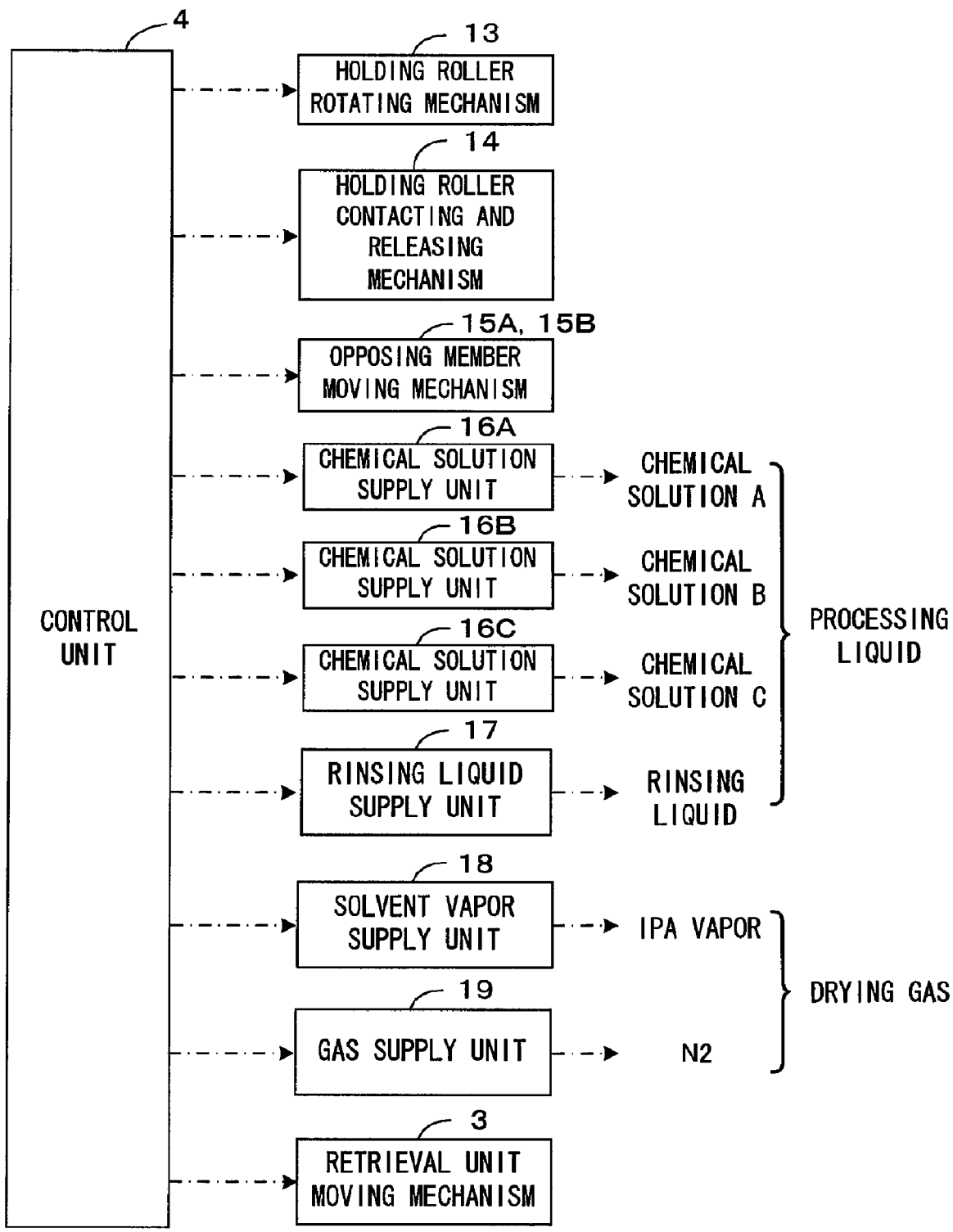
FIG. 2 is a block diagram showing a main control construction of the substrate processing apparatus shown in FIG. 1.

FIG. 1 is a diagram showing a first embodiment of a substrate processing apparatus according to the invention. FIG. 2 is a block diagram showing a main control construction of the substrate processing apparatus shown in FIG. 1. This substrate processing apparatus is a single wafer type substrate processing apparatus which is used to perform predetermined wet processing such as cleaning processing and etching processing and the like to a substantially disc-shaped substrate W such as a semiconductor wafer. More specifically, this is an apparatus which performs to the substrate W a chemical processing with a chemical solution, a rinsing processing with a rinsing liquid such as DIW (deionized water), and then a drying processing by supplying solvent vapor and nitrogen gas to the substrate W which has received a rinsing processing. When a chemical solution and a rinsing liquid are collectively called, they are referred to as a "processing liquid", and when solvent vapor and nitrogen gas are collectively called, they are referred to as "drying gas", hereinafter.

This substrate processing apparatus includes a processing unit 1 and a liquid retrieval unit 2. The processing unit 1 sequentially supplies plural kinds of processing liquid different from each other to the substrate W and performs wet processing with each processing liquid. The liquid retrieval unit 2 retrieves the plural kinds of processing liquid which are sequentially released after each wet processing from the processing unit 1 in a direction vertically downward, being divided into the respective kinds of processing liquid. The processing unit 1 is provided with a plurality of holding rollers 11 which hold the substrate W in an upright posture, and opposing members 12A and 12B which are disposed facing and away from the substrate W which is held by the holding rollers 11. In this embodiment, in order to perform wet processing to a top surface (pattern forming surface) Wf and to a rear surface Wb of the substrate W, the opposing member 12A is disposed facing and away from the substrate top surface Wf, and the opposing member 12B is disposed facing and away from the substrate rear surface Wb. In other words, the substrate W is arranged in a gap space (equivalent of "processing space" of the invention) S1 between the opposing members 12A and 12B.

Three or more of the holding rollers 11 are enough to securely hold the circular substrates W, and the holding rollers 11 are disposed equiangularly along the circumference of the substrate W. Consequently, the substrate W is held in an upright posture with its circumferential edge surface abutting on a side surface of the respective holding rollers 11. The plurality of holding rollers 11 are provided freely rotatable so as to hold and rotate the substrate W about a predetermined rotation shaft (horizontal shaft) J which extends in a horizontal direction X. At least one of the plurality of holding rollers 11 is connected to a holding roller rotating mechanism 13 including a motor so that the substrate W is rotated by a driving force of the holding rollers 11 by activating the holding roller rotating mechanism 13 according to an operation command from a control unit 4 which controls the entire apparatus. Consequently, the substrate W rotates about the rotation shaft J while being held in an upright posture by the plurality of holding rollers 11.

Further, each of the holding rollers 11 is structured so as to be switchable between a pressing state that it presses the substrate W at the circumferential edge surface thereof and a released state that it stays away from the circumferential edge surface of the substrate W. The holding rollers 11 are connected to a holding roller contacting and releasing mechanism 14. It is possible to make the plurality of holding rollers 11 in the pressing state or the released state in conjunction with each other by activating the holding roller contacting and releasing mechanism 14 according to an operation command from the control unit 4. Specifically, the control unit 4 activates the holding roller contacting and releasing mechanism 14 to set the plurality of holding rollers 11 in a released state upon loading and unloading the substrate W to and from the holding rollers 11, whereas in a pressing state upon performing a predetermined surface processing to the substrate W. The plurality of holding rollers 11 nip the circumferential edge surface of the substrate W to hold the substrate W in an upright posture in a pressing state.

Further, disc-shaped opposing members 12A and 12B each having an opening in a center thereof are arranged freely movable in the direction X near the top surface and the rear surfaces Wf and Wb of the substrate W held by the holding rollers 11, respectively. The opposing members 12A and 12B are connected to opposing member moving mechanisms 15A and 15B, respectively. Each of the opposing members 12A and 12B is structured to move to an adjacent position (position in FIG. 1) which is a position very close to the substrate W or conversely to move to a separated position which is away from the substrate W, when each of the opposing member moving mechanisms 15A and 15B operates according to an operation command from the control unit 4.

The two opposing members 12A and 12B are identically structured, perform chemical processing as described later upon receiving supply of a chemical solution suitable for cleaning processing or etching processing from chemical solution supply units 16A to 16C, and perform rinsing processing as described later upon receiving supply of a rinsing liquid such as DIW from a rinsing liquid supply unit 16.

Further, the opposing members 12A, 12B are connected to a solvent vapor supply unit 18 and a gas supply unit 19 and perform dry processing upon receiving supply of solvent vapor and nitrogen gas. In more detail, the opposing members 12A and 12B are arranged as follows. Since both opposing members 12A and 12B are identically structured, the description focuses on the arrangement of the opposing member 12A, and the description of the opposing member 12B is dispensed with.

A side surface 121 of the opposing member 12A is a substrate opposing surface opposing to the substrate W (substrate top surface Wf). A plan size of the side surface 121 is set to be equal to a diameter of the substrate W, or desirably greater than a diameter of the substrate W. Setting a plan size of the side surface 121 greater than the diameter of the substrate W ensures the processing liquid to reach a rim portion of an upper side of the substrate W, thereby improving uniformity of the surface processing of the substrate W. Further, a distance between the substrate W and the opposing member 12A which is disposed at the adjacent position is set to be not more than about 1 mm.

A supply portion 122 which is tubular and extends in the direction X is formed at a central part of the opposing member 12A. A supply port 123 is provided at a tip end of the supply portion 122, that is, at a central part of the side surface 121. A chemical solution, a rinsing liquid, a solvent vapor and a nitrogen gas can be selectively supplied from the supply port 123 to the gap space S1. Specifically, a base end of the supply portion 122 is connected to the chemical solution supply units 16A to 16C, the rinsing liquid supply unit 17, the solvent vapor supply unit 18, and the gas supply unit 19. The chemical solution supply units 16A to 16C selectively supply plural kinds of chemical solutions different from each other (three kinds of chemical solutions A to C in this embodiment). The rinsing liquid supply unit 17 supplies rinsing liquid such as DIW. The solvent vapor supply unit 18 supplies vapor of isopropyl alcohol (IPA). The gas supply unit 19 supplies nitrogen gas. Meanwhile, in this embodiment, a single supply port is provided at the central part of the side surface (substrate opposing surface) 121 of the opposing member 12A. However, a plurality of supply ports may be provided on the side surface 121. Further, in this embodiment, the processing liquid and the drying gas are supplied from a single supply port to the gap space S1. However, it may be constructed that the processing liquid and the drying gas are supplied to the gap space S1 from mutually different supply ports.

These supply units 16A to 16C and 17 to 19 are activated in accordance with an operation command from the control unit 4, and accordingly chemical solutions A to C, the rinsing liquid, the solvent vapor and the nitrogen gas can be selectively supplied from the supply port 123 to the gap space S1. Meanwhile, in this embodiment, IPA vapor is supplied from the solvent vapor supply unit 18. However, it may be constructed that vapor of alcohol solvent such as ethanol and methanol are supplied. Further, although nitrogen gas is supplied from the gas supply unit 19, it may be constructed that clean air, other inert gas, and the like are supplied.

Further, the opposing member 12B is constructed in the same way as the opposing member 12A. Specifically, a side surface 121 is a substrate opposing surface which opposes to the substrate W (substrate rear surface Wb). The chemical solutions A to C, the rinsing solution, the solvent vapor and the nitrogen gas can be selectively supplied from the supply port 123 to the gap space S1 by activating the supply units 16A to 16C and 17 to 19 in accordance with an operation command from the control unit 4.

FIG. 3 is a diagram showing a situation when the chemical solution is supplied to the gap space. When the chemical solution A is supplied from the chemical solution supply unit 16A to the gap space S1, the chemical solution A spreads to the entire gap space S1 due to the capillary phenomenon resulting from a surface tension of the chemical solution A, and the gap space S1 is filled with the chemical solution A liquid-tight. Consequently, chemical processing is performed to the substrate top and rear surfaces Wf and Wb with the chemical solution A which contacts the substrate top and rear surfaces Wf and Wb. The chemical solution A continues to be supplied to the gap space S1, and accordingly, the chemical solution which exists in the gap space S1 is replaced by the chemical solution freshly supplied from the chemical solution supply unit 16A to be pushed out of and removed from the gap space S1. The chemical processing is performed while replacing the chemical solution, which makes it possible to improve uniformity of surface processing. The chemical solution A which is pushed out of the gap space S1 after the chemical processing falls downwards vertically (direction Z) by its own weight, and is released from the gap space S1. Specifically, the chemical solution A is released from a communicating portion (equivalent to a "releasing portion" of the invention) 124 toward a lower space S2, the lower space S2 communicating the gap space S1 with the lower space S2 positioned vertically below the gap space S1.

While foregoing description is made on the case where the chemical solution A is supplied to the gap space S1, the same holds true for the case where the chemical solutions B, C and the rinsing liquid is supplied to the gap space S1 instead of the chemical solution A. For example, when the rinsing liquid is supplied from the rinsing liquid supply unit 17 to the gap space S1, the gap space S1 is filled liquid-tight with the rinsing liquid. The rinsing liquid is supplied continuously to the gap space S1, the rinsing liquid that exists in the gap space S1 is pushed out of the gap space S1 by the rinsing liquid freshly supplied from the rinsing liquid supply unit 17 and falls from the communicating portion 124 downwards vertically.

Next, the liquid retrieval unit 2 is described. The liquid retrieval unit 2 is disposed below the processing unit 1 and retrieves plural kinds of processing liquid, that is, the chemical solutions A to C and the rinsing liquid which are released sequentially from the communicating portion 124, being divided into the respective kinds of processing liquid. The liquid retrieval unit 2 is provided with a plurality of liquid retrieval tanks (each equivalent to a "liquid retriever" of the invention) 21 to 24 corresponding to plural kinds of processing liquid, that is, the chemical solution A to C and the rinsing liquid (waste liquid). Each of the plurality of liquid retrieval tanks 21 to 24 is formed in a shape of a flat box in order to minimize a space occupied by the plurality of liquid retrieval tanks 21 to 24 which are arranged. The respective liquid retrieval tanks 21 to 24 are arranged adjacent to each other in a horizontal direction (direction X). Specifically, the plural liquid retrieval tanks 21 to 24 are arranged in a direction (direction X) normal to the substrate W held by the holding rollers 11. And each of the liquid retrieval tanks 21 to 24 is formed that, in a horizontal plane, a size in a direction (direction X) normal to the substrate W is smaller than a size in a direction orthogonal to the direction (direction X) normal to the substrate W, or in a radial direction (direction Y) of the substrate W. In other words, the plural liquid retrieval tanks 21 to 24 are arranged to align such that a short side of each of the liquid retrieval tanks 21 to 24 is positioned in the direction X.

Each of the liquid retrieval tanks 21 to 24 has an opening at a top thereof, and a retrieval space for retrieving the processing liquid is formed inside thereof. A drain outlet (not shown) is formed at a bottom of each of the liquid retrieval tanks 21 to 24, and the respective drain outlets are connected to mutually different drains. For example, in this embodiment, the liquid retrieval tank 21 is a retrieval tank for retrieving the used chemical solution A after the chemical processing using the chemical solution A, and is communicated with a retrieval drain for retrieving the chemical solution A for reuse. Further, the liquid retrieval tank 22 is a retrieval tank for retrieving the used chemical solution B after the chemical processing using the chemical solution B, and is communicated with a retrieval drain for retrieving the chemical solution B for reuse. Further, the liquid retrieval tank 23 is a waste tank for draining the used rinsing liquid after the rinsing processing. Furthermore, the liquid retrieval tank 24 is a retrieval tank for retrieving the used chemical solution C after the chemical processing using the chemical solution C, and is communicated with a retrieval drain to retrieve the chemical solution C for reuse.

Further, the liquid retrieval unit 2 is movable freely in the direction X. The liquid retrieval unit 2 is connected to a retrieval unit moving mechanism 3. The retrieval unit moving mechanism 3 is driven in accordance with an operation command from the control unit 4, and accordingly, the liquid retrieval unit 2 can be moved in the direction X. One of the plural liquid retrieval tanks 21 to 24 is selectively arranged at a retrieval position corresponding to the kind of the processing liquid released from the communicating portion 124 by moving the liquid retrieval unit 2 in a stepwise fashion by driving the retrieval unit moving mechanism 3. This makes it possible to retrieve the processing liquid released from the communicating portion 124 separately in the liquid retrieval tanks 21 to 24. Specifically, the liquid retrieval unit 2 is moved to a position (hereinafter called a "chemical solution A retrieval position") where the liquid retrieval tank 21 is positioned directly below (downwards vertically) the communicating portion 124 during the chemical processing using the chemical solution A. Consequently, the chemical solution A released from the communicating portion 124 is retrieved in the liquid retrieval tank 21. Further, the liquid retrieval unit 2 is moved to a position (hereinafter called a "chemical solution B retrieval position") where the liquid retrieval tank 22 is positioned directly below the communicating portion 124 during the chemical processing using the chemical solution B. Consequently, the chemical solution B released from the communicating portion 124 is retrieved in the liquid retrieval tank 22. Furthermore, the liquid retrieval unit 2 is moved to a position (hereinafter called a "waste liquid position") where the liquid retrieval tank 23 is positioned directly below the communicating portion 124 during the rinsing processing. Consequently, the rinsing liquid released from the communicating portion 124 is collected in the liquid retrieval tank 23. Still further, the liquid retrieval unit 2 is moved to a position (hereinafter called a "chemical solution C retrieval position") where the liquid retrieval tank 24 is positioned directly below the communicating portion 124 during the chemical processing using the chemical solution C. Consequently, the chemical solution C released from the communicating portion 124 is retrieved in the liquid retrieval tank 24. Thus, in this embodiment, the retrieval unit moving mechanism 3 functions as a "selectively positioning unit" of the invention.

Figure 4:
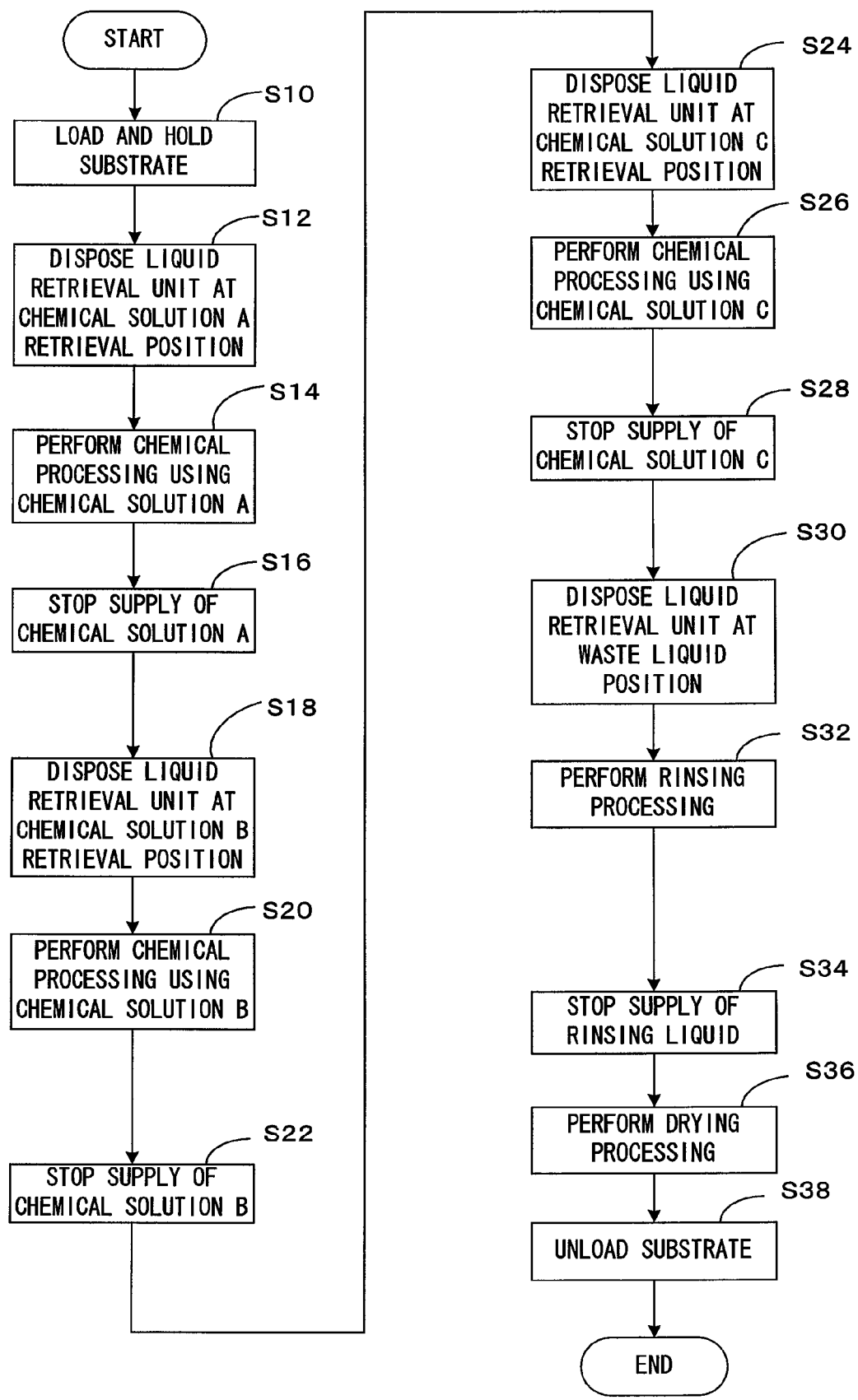
FIG. 4 is a flow chart showing the operation of the substrate processing apparatus.

Next, an operation of the substrate processing apparatus structured as above is described with reference to FIGS. 1 to 4. FIG. 4 is a flow chart showing the operation of the substrate processing apparatus. When an unprocessed substrate W is loaded into the apparatus by the substrate transporter (not shown), the control unit 4 controls respective parts of the apparatus and performs the chemical processing, the rinsing processing and the drying processing to the substrate W. The description is made here in the case where the substrate W is processed by sequentially supplying the chemical solutions A to C to the substrate W as the chemical processing. In this embodiment, the substrate W is loaded into the apparatus in an upright posture, and is held in the upright posture with the holding rollers 11 switched from the released state to the pressing state. Meanwhile, the opposing members 12A and 12B are positioned at separated positions to prevent interference with the substrate W.

When unprocessed substrate W is held by the holding rollers 11 (Step S10), the opposing members 12A and 12B are horizontally moved to their respective adjacent positions to be arranged close to the top and rear surfaces Wf and Wb of the substrate W. Consequently, the top and rear surfaces Wf and Wb of the substrate W are covered by the opposing members 12A and 12B respectively which are adjacent thereto. Then, the liquid retrieval unit 2 is moved to the chemical solution A retrieval position (Step S12), and the chemical processing using the chemical solution A is performed to the substrate W (Step S14). Specifically, the gap space S1 between the opposing members 12A and 12B is filled liquid-tight with the chemical solution A, and the top and rear surfaces Wf and Wb of the substrate W is processed with the chemical solution A. At this time, it is possible to increase the uniformity of the chemical processing to the top and rear surfaces Wf and Wb of the substrate W by rotating the substrate W. Further, continuous supply of the chemical solution A from the chemical supply unit 16A to the gap space S1 makes the chemical solution A which exists in the gap space S1 be replaced with the freshly supplied chemical solution A. As a result, the chemical solution A pushed out of the gap space S1 is released via the communicating portion 124 downwards vertically (in the direction Z) by its own weight. All of the chemical solution A thus released is retrieved in the liquid retrieval tank 21 positioned directly below the communicating portion 124 to be reused accordingly. Specifically, the chemical solution A released from the communicating portion 124 is retrieved in the liquid retrieval tank 21 without dispersing in an unintended direction.

When the chemical processing using the chemical solution A is completed after a predetermined time, supply of the chemical solution A to the gap space S1 is stopped (Step S14). The gap space S1 stays filled with the chemical solution A by means of a surface tension thereof. The opposing members 12A and 12B are separated from the substrate W, and accordingly, the chemical solution A is released from the gap space S1 which was held in the gap space S1 by a surface tension thereof. Consequently, the chemical solution A having filled the gap space S1 falls down to be retrieved in the liquid retrieval tank 21.

Subsequently, the liquid retrieval unit 2 is moved to the chemical solution B retrieval position (Step S18), and the chemical processing using the chemical solution B is performed to the substrate W (Step S20). Specifically, the gap space S1 is filled liquid-tight with the chemical solution B, and the top and rear surfaces Wf and Wb of the substrate W are processed with the chemical solution B. Further, the chemical solution B pushed out of the gap space S1 is released downwards vertically via the communicating portion 124 to be retrieved in the liquid retrieval tank 22.

Meanwhile, the rinsing liquid (DIW) may be supplied to the gap space S1 to rinse off the residual chemical solution A adhering to the opposing members 12A and 12B and the substrate W prior to the execution of the chemical processing using the chemical solution B. In this case, the rinsing liquid is supplied to the gap space S1 after the liquid retrieval unit 2 is moved to the waste liquid position either at a timing after the chemical solution A held in the gap space S1 is released as described above or at a timing when the supply of the chemical solution A is stopped. At this time, the rinsing liquid (including residual component of the chemical solution A) which is released from the gap space S1 via the communicating portion 124 is collected in the liquid retrieval tank 23 to be drained. This securely prevents the chemical solution A from mixing into the chemical solution B. Further, instead of supplying the rinsing liquid to the gap space S1, the retrieved chemical solution B (including residual component of the chemical solution A) may be drained for some time from the start of the execution of the chemical processing with the chemical solution B. This also ensures to prevent the chemical solution A from mixing into the chemical solution B.

Subsequently to the completion of the chemical processing using the chemical solution B (Step S22), the chemical processing using the chemical solution C is performed in the same manner as the chemical processing using the chemical solutions A and B. Specifically, after the liquid retrieval unit 2 is moved to the chemical solution C retrieval position (Step S24), the gap space S1 is filled liquid-tight with the chemical solution C, and the top and rear surfaces Wf and Wb of the substrate W are processed with the chemical solution C (Step S26). Further, the chemical solution C pushed out of the gap space S1 is released downwards vertically via the communicating portion 124 to be retrieved in the liquid retrieval tank 24. Meanwhile, in order to prevent the chemical solution B from mixing into the chemical solution C, the rinsing liquid may be supplied to the gap space S1 before the execution of the chemical processing using the chemical solution C or the retrieved chemical solution C (including residual component of the chemical solution B) may be arranged to be drained for some time from the start of the execution of the chemical processing using the chemical solution C as described above.

When the chemical processing using the chemical solutions A to C is completed in a manner described above (Step S28), the liquid retrieval unit 2 is moved to the drained liquid position (Step S30), and the rinsing processing is performed to the substrate W (Step S32). Specifically, the rising liquid (DIW) is supplied to the gap space S1, and the chemical component remaining in the gap space S1 is washed off with the rinsing liquid. Further, because of the continuous supply of the rinsing liquid to the gap space S1, the rinsing liquid pushed out of the gap space S1 is released downwards vertically by its own weight via the communicating portion 124. All the rinsing liquid thus released is collected in the liquid retrieval tank 23 positioned directly below the communicating portion 124 to be drained.

When the rinsing processing for a predetermined time is completed, supply of the rinsing liquid to the gap space S1 is stopped (Step S34). Then, the gap space S1 is filled liquid-tight with the rinsing liquid (DIW) due to a surface tension thereof And the drying processing is performed in this state (Step S36). Specifically, IPA vapor is supplied to the gap space S1, the rinsing liquid existing in the gap space S1 is replaced with IPA, and is discharged from the gap space S1. The rinsing liquid is thus replaced with IPA, and accordingly, drying of the substrate W can be accelerated due to a volatility of IPA. Further, nitrogen gas is supplied to the gap space S1 after the supplying of IPA vapor, and accordingly, the top and rear surfaces Wf and Wb of the substrate W are dried. Upon completion of the drying processing of the substrate W, after the opposed members 12A and 12B are positioned at the separated position, the holding of the substrate by the holding rollers 11 is released, and the processed substrate W is unloaded from the apparatus (Step S38).

As described above, according to this embodiment, the processing liquid (the chemical solution and the rinsing liquid) after the processing is sequentially released from the communicating portion after each execution of the chemical processing and the rinsing processing, and the liquid retrieval unit 2 moves relative to the processing unit 1, and accordingly, one of the plural liquid retrieval tanks 21 to 24 is selectively arranged at the retrieval position corresponding to the kind of processing liquid released from the communicating portion 124. Hence, it is possible to retrieve the processing liquid in the liquid retrieval unit 2 separately with respect to the kind of the processing liquid.

Further, the liquid retrieval unit 2 is separated from the processing unit 1 and arranged vertically below the processing unit 1, and each of the liquid retrieval tanks 21 to 24 is constructed to retrieve the processing liquid released from the communicating portion 124 downwards vertically with respect to the gap space S1. Consequently, the destination to which the processing liquid is released from the communicating portion 124 is limited to vertically below the gap space S1, and the processing liquid can be prevented from dispersing in an unintended direction. This ensures that the processing liquid released from the communicating portion 124 is retrieved in the liquid retrieval tanks 21 to 24. Moreover, since the processing liquid released from the communicating portion 124 is retrieved directly in the liquid retrieval tanks 21 to 24 without going through pipes and the like, it is possible to prevent the processing liquid from remaining within the pipes. Consequently, it is possible to prevent decrease in retrieval rate of the processing liquid due to a residual processing liquid in the pipes, and to prevent other kinds of processing liquid from mixing into the retrieved processing liquid.

Further, since the destination to which the processing liquid is released is limited to a predetermined direction (vertical direction) below the gap space S1, a liquid-contacting surface each of the liquid retrieval tanks 21 to 24 comes in contact with the processing liquid can be reduced relatively, and an amount of the processing liquid remaining in each of the liquid retrieval tanks 21 to 24 can be reduced. Specifically, in the apparatus described in JP-A-5-190442, in order to retrieve the chemical solution shaken off from the entire circumference of the substrate, a cup (liquid retriever) is arranged so as to surround a spin chuck which rotatably holds the substrate W. Consequently, area space of the internal surface (liquid-contacting surface) of the cup is relatively large, the chemical solution shaken off from the substrate to adhere to the internal surface of the cup, and accordingly, the amount of chemical solution remaining within the cup increases. As a result, there have been problems such as contamination of the substrate due to residual chemical solution in the cup, and decrease of a retrieval rate of the chemical solution. On the other hand, according to this embodiment, since the destination to which the processing liquid is released is limited, the amount of processing liquid adhering to the liquid retriever is reduced and the above problem can be prevented.

Further, according to this embodiment, since the direction in which the processing liquid is released and the direction of gravity imposed on the processing liquid are matched by arranging the processing liquid to be released downwards vertically, power of gravity can be used in retrieving the processing liquid released from the communicating portion 124 in the liquid retrieval tanks 21 to 24, and it is easy to retrieve the processing liquid.

In other words, this embodiment comprises: a processing unit that includes a processing space in which a substrate is arranged, sequentially supplies mutually different plural kinds of processing liquid to the processing space to perform a predetermined wet processing to the substrate with respect to each processing liquid, releases the processing liquid used in the wet processing from a releasing portion downwards of the processing space in a predetermined direction upon each execution of the wet processing; a liquid retrieval unit that includes plural liquid retrievers, is separated from the processing unit, and is disposed below the processing unit, the plural liquid retrievers retrieving the plural kinds of processing liquid sequentially released from the releasing portion at each retrieval position predetermined with respect to each kind of the processing liquid; and a selectively positioning unit that relatively moves the processing unit and the liquid retrieval unit to selectively position each of the liquid retrievers at each retrieval position corresponding to the kind of the processing liquid released from the releasing portion.

According to the embodiment thus structured, mutually different plural kinds of processing liquid are sequentially supplied to the processing space in which the substrate is arranged, and the wet processing is performed to the substrate with respect to each processing liquid. Further, the processing liquid used in the wet processing is sequentially released upon each execution of the wet processing. The liquid retriever is selectively positioned at the retrieval position corresponding to the kind of the processing liquid released from the releasing portion by relatively moving the processing unit and the liquid retrieval unit. Consequently, it is possible to retrieve the processing liquid in the liquid retrieval unit separately with respect to the kind of the processing liquid.

Further, the liquid retrieval unit is separated from the processing unit and is disposed below the processing unit. The processing liquid is released from the releasing portion downwards of the processing space in a predetermined direction. Consequently, the destination of the released processing liquid is limited to the predetermined direction downwards of the processing space. Hence, the processing liquid is prevented from dispersing in an unintended direction. This ensures the processing liquid released from the releasing portion to be retrieved in the liquid retriever without fail. Further, the processing liquid released from the releasing portion is thus retrieved at the retrieval position corresponding to the kind of the processing liquid. Hence, it is possible to securely separate to retrieve the plural kinds of the processing liquid. Furthermore, the processing liquid released from the releasing portion is retrieved directly in the liquid retriever without going through pipes and the like. Hence, it is possible to prevent the processing liquid from remaining in the pipes. Consequently, it is possible to prevent decrease in retrieval rate of the processing liquid due to a residual processing liquid in the pipes, and to prevent other kinds of processing liquid from mixing into the retrieved processing liquid.

Further, in this embodiment, the processing liquid is released from the releasing portion downwards vertically, and the selectively positioning unit positions the liquid retriever at the retrieval position corresponding to the kind of the processing liquid released downwards vertically from the releasing portion.

According to this arrangement, the processing liquid released from the releasing portion downwards vertically is retrieved in the liquid retriever which is positioned vertically below the releasing portion. Consequently, the direction in which the processing liquid is released and the direction of gravity imposed on the processing liquid can be matched. Hence, power of gravity can be used in retrieving the processing liquid released from the releasing portion in the liquid retriever, and the retrieval of the processing liquid becomes easy.

Further, in this embodiment, each of the plural liquid retrievers is formed in a shape of a box, and the respective liquid retrievers are arranged adjacent to each other in a horizontal direction.

Arranging this way can minimize a space occupied by the plural liquid retrievers which are arranged.

<Second Embodiment>

Figure 5A:
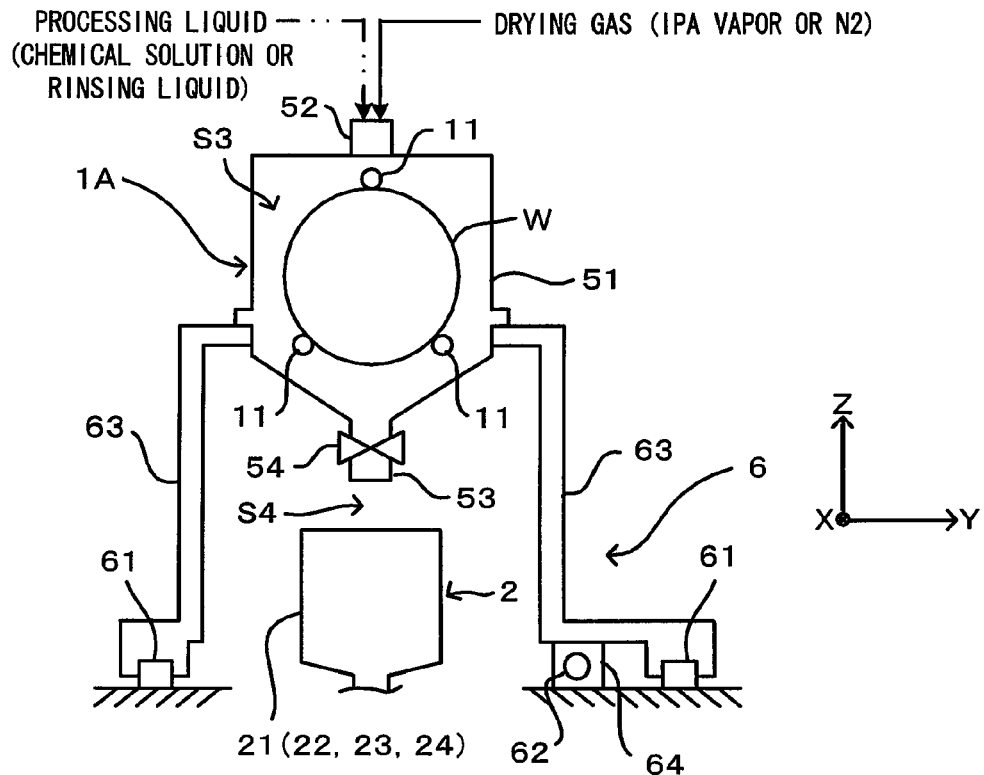
FIG. 5 is a diagram showing a second embodiment of the substrate processing apparatus according to the invention.
Figure 5B:
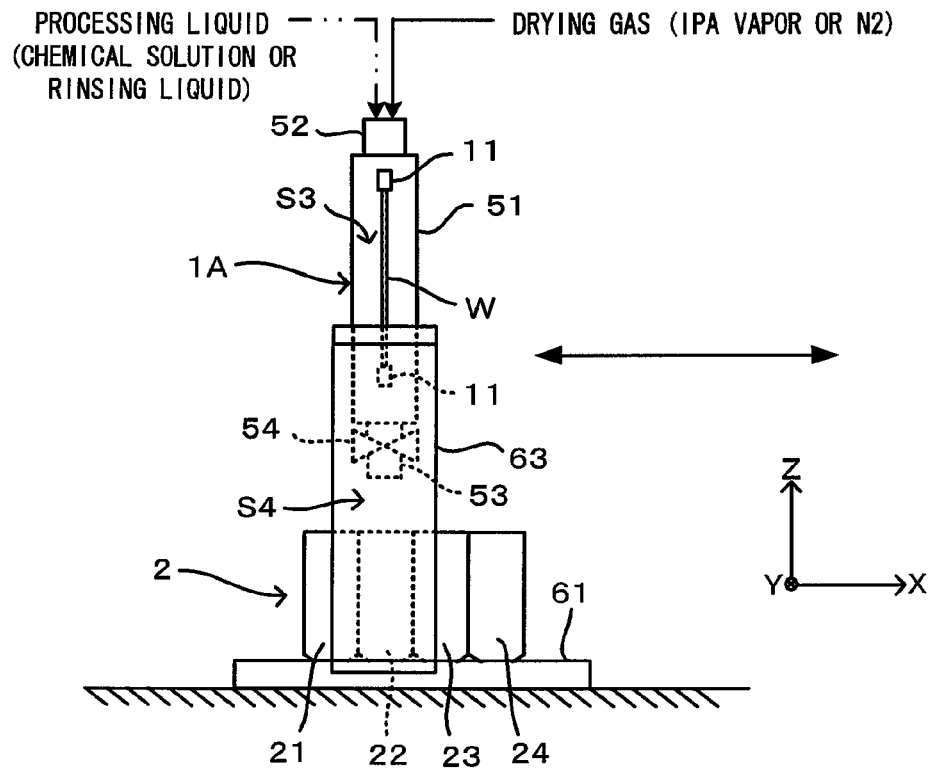
Figure 6:
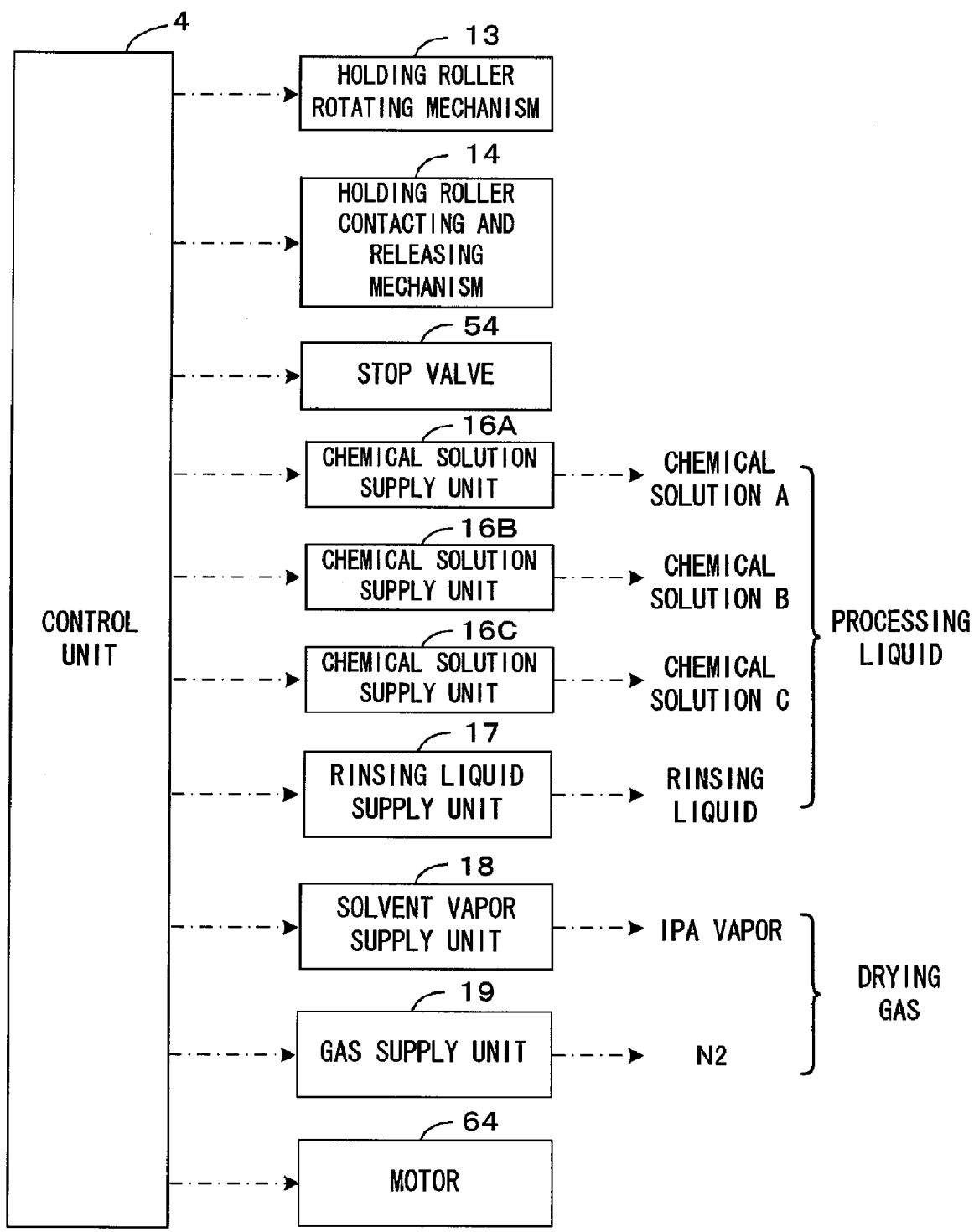
FIG. 6 is a block diagram showing a main control construction of the substrate processing apparatus shown in FIG. 5.

FIG. 5 is a diagram showing a second embodiment of the substrate processing apparatus according to the invention. FIG. 6 is a block diagram showing a main control construction of the substrate processing apparatus shown in FIG. 5. In the substrate processing apparatus of the second embodiment, the wet processing is performed to the substrate W by introducing the processing liquid into the processing tank with a single substrate W stored therein. In this substrate processing apparatus, a processing unit 1A is provided with a processing tank 51 which is formed in a shape of a flat box. A storage space (equivalent of a "processing space" of the invention) S3 which can store the substrate W is formed inside the processing tank 51.

A supply portion 52 is formed on a top of the processing tank 51. The chemical solutions A to C, the rinsing liquid, the solvent vapor and the nitrogen gas can be supplied via the supply portion 52 to the storage space S3. Specifically, a base end of the supply portion 52 is connected to the chemical solution supply unit 16A to 16C, the rinsing liquid supply unit 17, the solvent vapor supply unit 18 for supplying IPA vapor, and the gas supply unit 19. The chemical solutions A to C, the rinsing liquid, the solvent vapor and the nitrogen gas can be selectively supplied from the supply portion 52 to the storage space S3 by activating the supply units 16A to 16C and 17 to 19 in accordance with an operation command from the control unit 4.

A discharging portion 53 for discharging the processing liquid supplied to the storage space S3 is formed at a lower end of the processing tank 51, the discharging portion 53 being tubular and extending downwards vertically (in the direction Z). The processing liquid inside the storage space S3 can be released from the discharging portion 53. A stop valve 54 is mounted on the discharging portion 53 so that the release and/or the stop of release of the processing liquid from the storage space S3 can be controlled by opening and closing the stop valve 54. Specifically, when the stop valve 54 is opened, the processing liquid in the storage space S3 falls downwards vertically by its own weight, and accordingly, is released from the storage space S3. In other words, the processing liquid is released from the storage space S3 toward a lower space S4 which is located vertically below the storage space S3. On the other hand, when the stop valve 54 is closed, the release of the processing liquid from the storage space S3 is stopped. Further, the stop valve 54 can control a flow rate (rate of discharge) of the processing liquid released from the storage space S3 by adjusting a degree of opening of the stop valve 54.

Further, similar to the first embodiment, the substrate W is held rotatably in an upright posture by the plural holding rollers 11. Specifically, by activating the holding roller rotating mechanism 13 in accordance with an operation command from the control unit 4, the substrate W rotates about the horizontal axis while being held in an upright posture by the plural holding rollers 11. Meanwhile, in this embodiment, a single wafer processing is performed by storing a single substrate W in the storage space S3. However, plural (5 for instance) substrates W may be stored in the storage space S3 and the processing (batch processing) may be executed to the plural substrates W collectively.

Further, the processing unit 1A is freely movable in the direction X. Specifically, the processing unit 1A is connected with a processing unit moving mechanism (equivalent of "selectively positioning unit" of the invention) 6. Therefore, the processing unit 1A can be moved in the direction X by activating the processing unit moving mechanism 6. Concretely, the processing unit moving mechanism 6 includes two guides 61, 61. The two guides 61, 61 sandwich the processing unit 1A from both sides and are disposed in parallel with each other extending in the direction X. Further, a ball screw 62 is disposed extending in the direction X. Stays 63, 63 that are threadably mounted on the ball screw 62 are interlinked with both sides of the processing unit 1A. The processing unit 1A is supported above the liquid retrieval unit 2 by the stays 63, 63. When a motor 64 is driven in accordance with an operation command from the control unit 4, the ball screw 62 rotates in response to the driving of the motor. Consequently, the stays 63 threadably mounted on the ball screw 62 can be moved reciprocally in the direction X. Therefore, driving the motor 64 enables the processing unit 1A to reciprocate in the direction X above the liquid retrieval unit 2.

The liquid retrieval unit 2 is disposed below the processing unit 1A. The liquid retrieval unit 2 is arranged in the same way as the first embodiment, and includes the plural liquid retrieval tanks 21 to 24 corresponding to the plural kinds of the processing liquid, that is, the chemical solutions A to C and the rinsing liquid. The plural liquid retrieval tanks 21 to 24 are arranged such that a short side of each of the liquid retrieval tanks 21 to 24 is aligned in a direction which a short side of the processing tank 51 extends, that is, in a direction (direction X) normal to the substrate W which is held inside the processing tank 51. With this construction, the apparatus can be compacted in the direction X and downsized.

The processing unit 1A is moved in a stepwise fashion by driving the motor 64, and accordingly, one of the plural liquid retrieval tanks 21 to 24 is selectively arranged at a retrieval position corresponding to the kind of the processing liquid released from the discharging portion 53. Specifically, the processing unit 1A is moved so that the liquid retrieval tank 21 is positioned (chemical solution A retrieval position) directly below the discharging portion 53 during the chemical processing using the chemical solution A. Consequently, the chemical solution A released from the discharging portion 53 is retrieved in the liquid retrieval tank 21. Further, the processing unit 1A is moved so that the liquid retrieval tank 22 is positioned (chemical solution B retrieval position) directly below the discharging portion 53 during the chemical processing using the chemical solution B. Consequently, the chemical solution B released from the discharging portion 53 is retrieved in the liquid retrieval tank 22. Further, the processing unit 1A is moved so that the liquid retrieval tank 23 is positioned (waste liquid position) directly below the discharging portion 53 during the rinsing processing. Consequently, the rinsing liquid released from the discharging portion 53 is retrieved in the liquid retrieval tank 23. Furthermore, the processing unit 1A is moved so that the liquid retrieval tank 24 is positioned (chemical solution C retrieval position) directly below the discharging portion 53 during the chemical processing using the chemical solution C. Consequently, the chemical solution C released from the discharging portion 53 is retrieved in the liquid retrieval tank 24.

Figure 7:
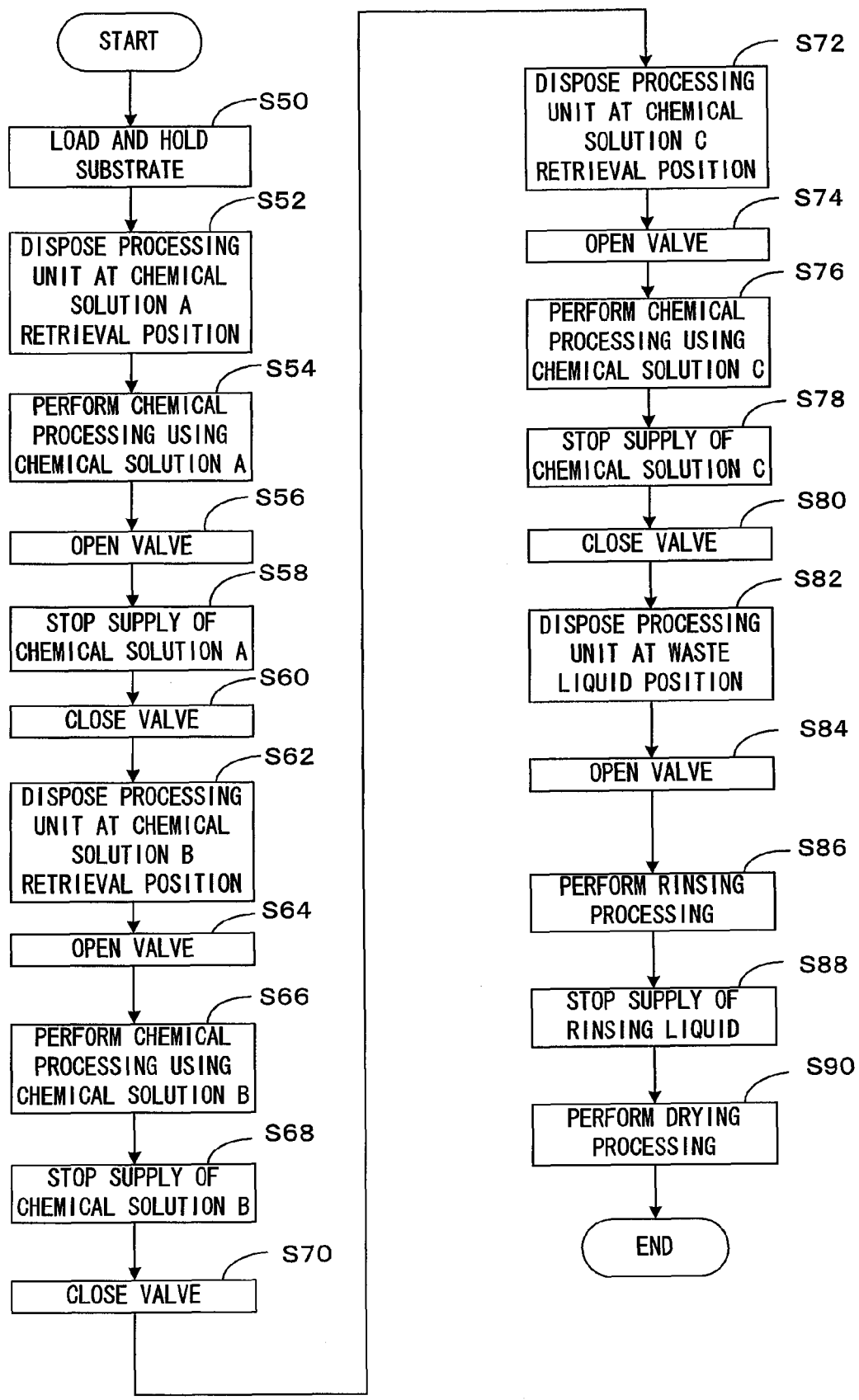
FIG. 7 is a flow chart showing an operation of the substrate processing apparatus of the second embodiment.

FIG. 7 is a flow chart showing an operation of the substrate processing apparatus of the second embodiment. In the apparatus arranged as described above, when the substrate W is loaded into the inside of the processing tank 51 and is held by the holding rollers 11 (Step S50), the chemical processing, the rinsing processing and the drying processing are performed to the substrate W as follows. At first, the processing unit 1A is moved to be positioned (chemical solution A retrieval position) above the liquid retrieval tank 21 (Step S52), and the chemical processing using the chemical solution A is performed (Step S54). Specifically, the chemical solution A is introduced into the storage space S3, the storage space S3 is filled with the chemical solution A, and the top and rear surfaces Wf and Wb of the substrate W are processed with the chemical solution A. At this time, a uniformity of the chemical processing to the top and rear surfaces Wf and Wb of the substrate W can be enhanced by rotating the substrate W. Further, the chemical solution A existing inside the storage space S3 is replaced with the chemical solution A freshly supplied from the supply portion 52 by continuing to supply the chemical solution to the storage space S3 and opening the stop valve 54 to a predetermined degree of opening to release a part of the chemical solution in the storage space S3 (Step S56). The chemical solution A is released from the storage space S3 via the discharging portion 53 downwards vertically by its own weight. All of the chemical solution A thus released is retrieved in the liquid retrieval tank 21 which is positioned directly below the discharging portion 53 to be reused accordingly.

When the chemical processing using the chemical solution A is completed, supply of the chemical solution A to the storage space S3 is stopped (Step S58). Then, after releasing the chemical solution A remaining in the storage space S3 from the discharging portion 53, the stop valve 54 is closed (Step S60). Subsequently, the processing unit 1A is moved to be positioned (chemical solution B retrieval position) above the liquid retrieval tank 22 (Step S62), the stop valve 54 is opened (Step S64), and the chemical processing using the chemical solution B is performed (Step S66). At this time, the chemical solution B released from the storage space S3 via the discharging portion 53 is retrieved in the liquid retrieval tank 22 to be reused accordingly.

Meanwhile, the rinsing liquid (DIW) may be supplied to the storage space S3 to replace and rinse off the remaining chemical solution A within the processing tank 51 and on the substrate W prior to the execution of the chemical processing using the chemical solution B. In this case, the rinsing liquid is supplied to the storage space S3 after the processing unit 1A is moved to a position (waste liquid position) above the liquid retrieval tank 23 at a timing when the supply of the chemical solution A is stopped. Alternatively, the rinsing processing may be performed at a timing after the chemical solution A is released. The rinsing liquid (including residual component of the chemical solution A) which is released via the discharging portion 53 from the storage space S3 is collected in the liquid retrieval tank 23 to be drained. This completely prevents the chemical solution A from mixing into the chemical solution B. Further, instead of supplying the rinsing liquid to the storage space S3, the retrieved chemical solution B (including residual component of the chemical solution A) may be drained for some time from the start of the execution of the chemical processing with the chemical solution B.

Subsequently to the completion of the chemical processing using the chemical solution B (Step S68), with the stop valve 54 closed (Step S70), the processing unit 1A is moved to a position (chemical solution C retrieval position) above the liquid retrieval tank 24 (Step S72). Then, with the stop valve 54 opened (Step S74), the chemical processing using the chemical solution C is performed (Step S76). At this time, the chemical solution C released via the discharging portion 53 from the storage space S3 is retrieved in the liquid retrieval tank 24 to be reused accordingly.

When the chemical processing using the chemical solutions A to C is thus completed (Step S78), with the stop valve 54 closed (Step S80), the processing unit 1A is moved to a position (waste liquid position) above the liquid retrieval tank 23 (Step S82). Then, with the stop valve 54 opened (Step S84), the rinsing processing is performed to the substrate W (Step S86). Specifically, the residual component of the chemical solution remaining in the storage space S3 is rinsed away by opening the stop valve 54 while continuing to supply the rinsing liquid to the storage space S3. The rinsing liquid released from the storage space S3 via the discharging portion 53 is collected in the liquid retrieval tank 23 for disposal.

When the rinsing processing is completed (Step S88), supply of the rinsing liquid to the storage space S3 is stopped. Subsequently, the drying processing is performed to the substrate W by introducing the IPA vapor and the nitrogen gas to the storage space S3 (Step S90).

As described above, according to this embodiment, while the processing liquid (the chemical solution and the rising liquid) which has completed the processing task is sequentially released from the discharging portion 53 at every execution of the chemical processing and the rinsing processing, the processing unit 1A is moved so that one of the plural liquid retrieval tanks 21 to 24 to be selectively positioned at the retrieval position corresponding to the kind of the processing liquid released from the discharging portion 53. Consequently, the processing liquid can be retrieved in the plural liquid retrieval tanks 21 to 24 separately with respect to each kind of the processing liquid.

Further, similar to the first embodiment, the liquid retrieval unit 2 is positioned vertically below the processing unit 1A separately from the processing unit 1A, and each of the liquid retrieval tanks 21 to 24 is arranged to retrieve the processing liquid released downwards vertically from the discharging portion 53. Consequently, a destination of the processing liquid released from the discharging portion 53 is limited to vertically below the storage space S3. Hence, the processing liquid is prevented from dispersing in an unintended direction. This ensures the processing liquid released from the discharging portion 53 to be retrieved in the liquid retrieval tanks 21 to 24.

In addition, similar to the first embodiment, since the processing liquid released from the discharging portion 53 is retrieved directly in the liquid retrieval tanks 21 to 24 without going through pipes and the like, the processing liquid is prevented from remaining in the pipes. Consequently, it is possible to prevent decrease in retrieval rate of the processing liquid due to a residual processing liquid in the pipes, and to prevent other kinds of processing liquid from mixing into the retrieved processing liquid.

Furthermore, according to this embodiment, since a single discharging portion 53 is mounted at the lower end of the processing unit 1A, the release of the processing liquid from the processing unit 1A is limited to one place. Therefore, a releasing range to which the processing liquid is released from the discharging portion (releasing portion) 53 can be limited to a relatively narrow range, thus ensuring that the processing liquid released from the discharging portion 53 be retrieved in the liquid retrieval tanks 21 to 24. Furthermore, providing a releasing portion at the lower end of the processing unit 1A makes it possible to have the processing liquid supplied to the storage portion S3 released from the discharging portion 53 by the weight of the processing liquid itself.

In other words, in this embodiment, the releasing portion is singularly provided at a lower end of the processing unit.

With such an arrangement, the release of the processing liquid from the processing unit is limited to one place. Hence, a releasing range to which the processing liquid is released from the releasing portion can be limited to a relatively narrow range, thus ensuring that the processing liquid released from the releasing portion be retrieved in the liquid retriever. Furthermore, providing the releasing portion at a lower end of the processing unit makes it possible to let the processing liquid supplied to the processing space be released from the releasing portion by the weight of the processing liquid itself.

Further, in this embodiment, each of the processing unit and the plural liquid retrievers is formed in a shape of a flat box, and the plural liquid retrievers are arranged such that a short side of each of the liquid retrievers is aligned in a direction which a short side of the processing unit extends.

According to this arrangement, the apparatus can be arranged compactly in the direction to which the short side of the processing unit extends, thereby downsizing the apparatus.

<Third Embodiment>

Figure 8A:
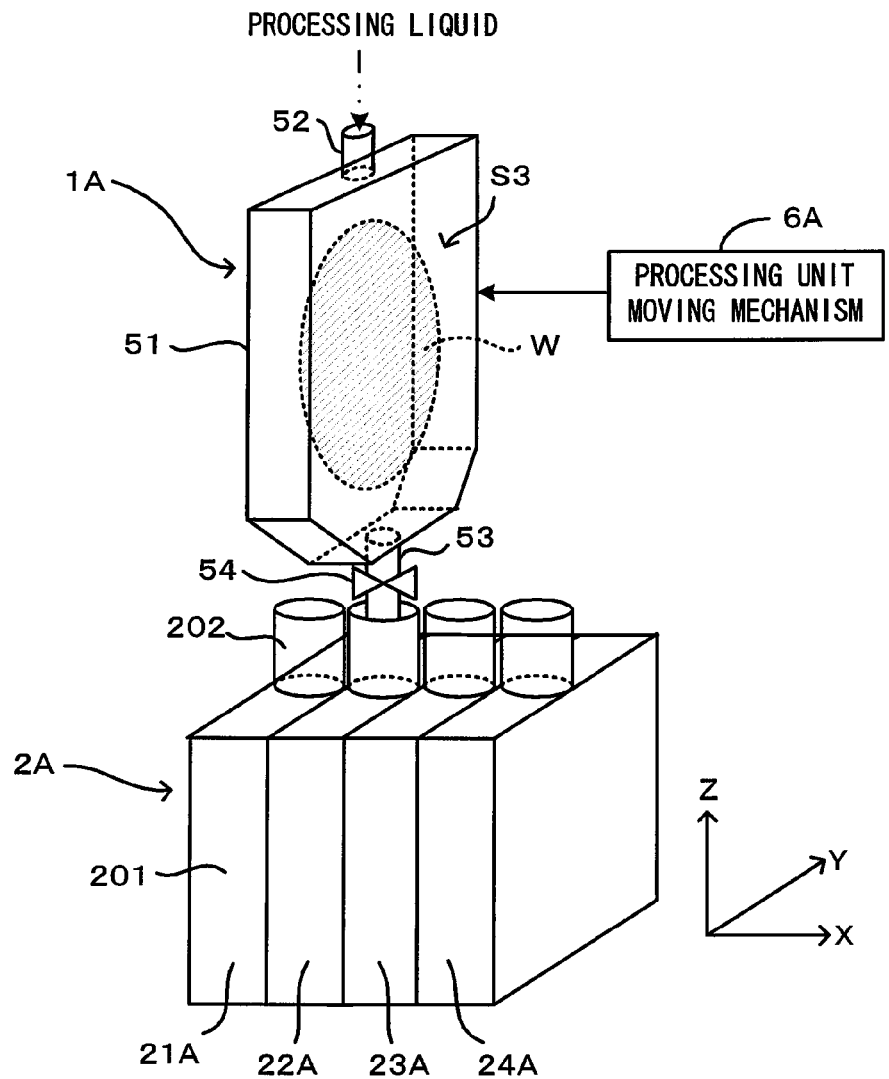
FIGS. 8A and 8B are diagrams showing a third embodiment of the substrate processing apparatus according to the invention.
Figure 8B:
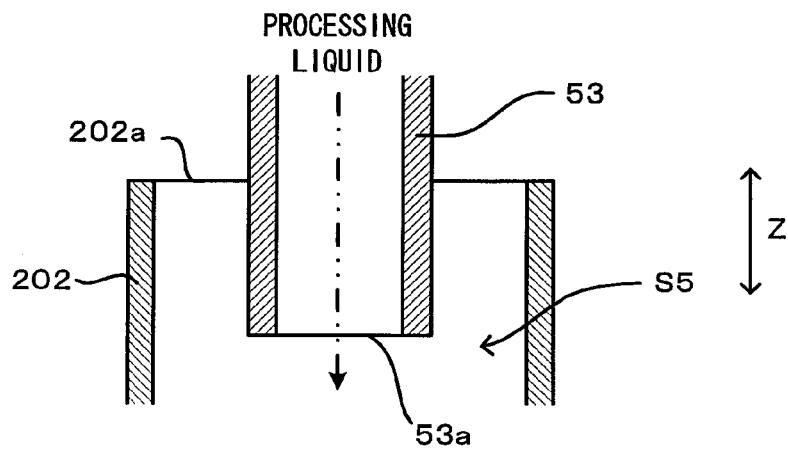

FIGS. 8A and 8B are diagrams showing a third embodiment of the substrate processing apparatus according to the invention. FIG. 8A is a diagram showing an entire apparatus, and FIG. 8B is a diagram showing an enlarged view of a main part of the apparatus. The substrate processing apparatus of the third embodiment principally differs from that of the second embodiment in that the discharging portion 53 is positioned in the internal space of the liquid retrieval tank during the wet processing (while retrieving the processing liquid). Otherwise, the embodiment is arranged and operated in the same way as the second embodiment, therefore, the same reference numerals are used and the description thereof is dispensed with.

In this embodiment, the processing unit 1A is supported to be movable freely in the direction Z in addition to the direction X. The processing unit 1A is connected with a processing unit moving mechanism 6A. The processing unit 1A can be moved horizontally in the direction X and moved up and down in the direction Z by driving the processing unit moving mechanism 6A in accordance with an operation command from the control unit 4.

Further, a liquid retrieval unit 2A includes plural liquid retrieval tanks 21A to 24A. Each of plural liquid retrieval tanks 21A to 24A includes a tank main body 201 in a shape of a box, and an extension part 202 on a top part thereof which extends upward from the tank main body 201 and of which inside is hollow. Specifically, a top surface of the tank main body 201 is closed except for the extension part 202, and it is arranged so that the processing liquid is retrieved via the extension part 202. A diameter of an opening of the extension part 202 is formed to be greater than an outer diameter of the discharging portion 53 so that the discharging portion 53 can be inserted into the hollow portion (internal space of the liquid retrieval tank) of the extension part 202. Further, the opening of the extension part 202 is formed in a round shape corresponding to a shape (round shape) of the external diameter of the discharging portion 53, that is, in a similarity shape.

When the wet processing (the chemical processing and the rinsing processing) is performed, the processing unit 1A is moved to a position above the liquid retrieval tanks 21A to 24A corresponding to a kind of the processing liquid, and subsequently is moved down, prior to the release of the processing liquid from the discharging portion 53. Consequently, the discharging portion 53 gets into the internal space of the liquid retrieval tanks 21A to 24A. Specifically, each of the plural liquid retrieval tanks 21A to 24A has a retrieval space S5 formed therein for retrieving the processing liquid. A leading end (bottom head) 53a of the discharging portion 53 with a releasing outlet of the processing liquid formed therein is positioned inside the retrieval space S5 (FIG. 8B). Concretely, the processing unit 1A is moved so that the leading end 53a of the discharging portion 53 is positioned below a top end 202a of the extension part 202. The processing liquid is released from the discharging portion 53 to be retrieved in the liquid retrieval tanks 21A to 24A, in a condition that the leading end 53a of the discharging portion 53 is positioned inside the retrieval space S5. Consequently, the processing liquid released from the discharging portion 53 is securely retrieved in the liquid retrieval tanks 21A to 24A. Further, it is possible to prevent the processing liquid atmosphere within the retrieval space S5 from dispersing to a space outside the liquid retrieval tanks 21A to 24A.

In other words, in this embodiment, each of the plural liquid retrievers includes a retrieval space therein for retrieving the processing liquid, and the selective positioning unit positions the releasing portion inside the retrieval space prior to the release of the processing liquid from the releasing portion.

According to this construction, it is possible to securely retrieve the processing liquid released from the releasing portion in the liquid retriever without fail, and to prevent the processing liquid atmosphere inside the retrieval space from dispersing to the space outside the liquid retriever from the retrieval space.

<Others>

Figure 9:
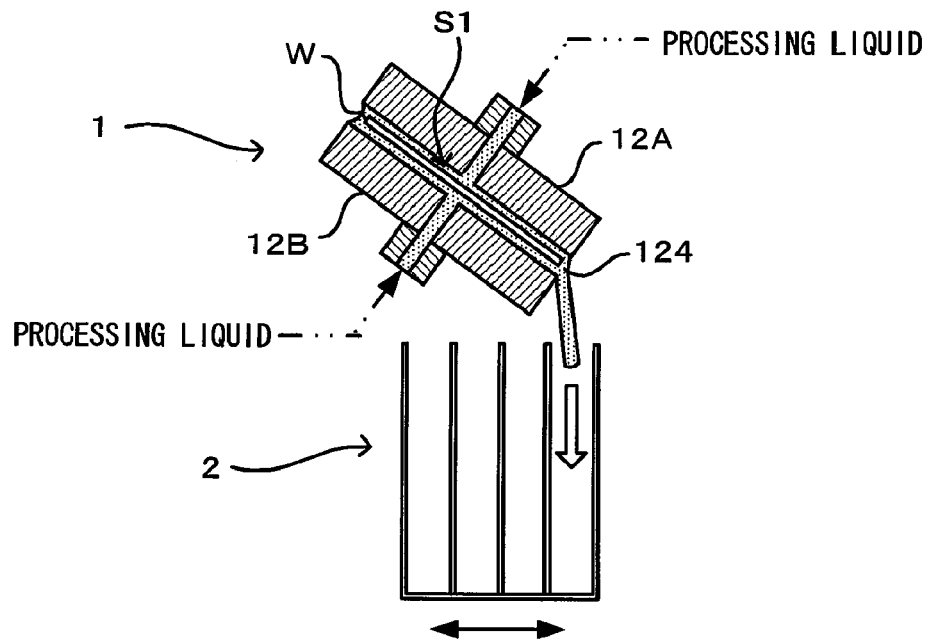
Figure 10:
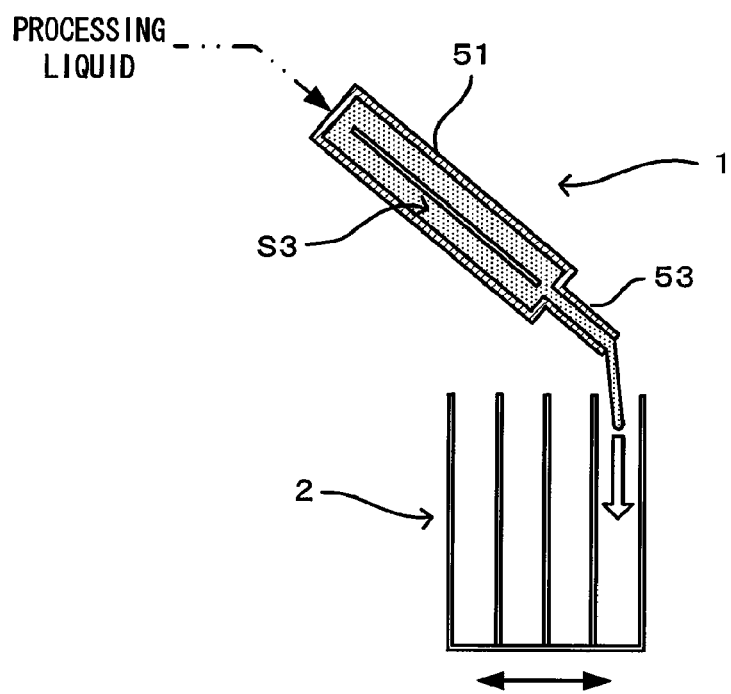

The invention is not limited to the embodiments above but may be modified to the extent not deviating from the intention of the invention. For example, in the above first embodiment, although the wet processing is performed in a condition that the substrate W is in an upright posture, the application of the invention is not limited to this. For instance, in the above first embodiment, the opposing members 12A and 12B may be positioned adjacent to and opposing to the top and rear surfaces of the substrate W while the substrate W is held in a tilted posture (FIG. 9). Even if the wet processing is performed in such a posture, the processing liquid released form the gap space S1 downward via the communicating portion 124 can be preferably separated according to the kind of the processing liquid and retrieved. Similarly, in the above second embodiment, the wet processing may be performed with the substrate W in a tilted posture by arranging the processing tank 51 tilted (FIG. 10). Even in this instance, the processing liquid released from the storage space S3 downward via the discharging portion 53 can be preferably separated according to the kind of the processing liquid and retrieved.

Further, although the above first embodiment is arranged to separately retrieve the processing liquid by moving the liquid retrieval unit 2 while the processing unit 1 is fixedly positioned, it may be arranged to separately retrieve the processing liquid by moving the processing unit 1 while the liquid retrieval unit 2 is fixedly positioned. Further, although the above second and third embodiments are arranged to separately retrieve the processing liquid by moving the processing unit 1A while the processing unit 1A is fixedly positioned, it may be arranged to separately retrieve the processing liquid by moving the liquid retrieval units 2 and 2A while the processing unit 1A is fixedly positioned. Furthermore, it may be arranged that the processing unit and the liquid retrieval unit are both moved simultaneously.

Further, although the above embodiments are arranged to retrieve the processing liquid released from a single processing unit in one of the plural liquid retrieval tanks, this is not limiting. It may be arranged to retrieve the respective processing liquids released simultaneously from plural processing units selectively in a liquid retrieval tank corresponding to the kind of the processing liquid. For instance, in the above second embodiment, the chemical processing may be performed simultaneously in two processing tanks 51A and 51B (the chemical processing using the chemical solution A is performed in the processing tank 51A, whereas the chemical processing using the chemical solution B is performed in the processing tank 51B), and the respective chemical solutions A and B released from the respective processing tanks 51A and 51B may be retrieved in the respective liquid retrieval tanks 21 and 22 corresponding to the kind of the chemical solution as shown in FIG. 11. It is possible to improve a throughput of the apparatus while processing the substrate W one by one (single wafer processing) by performing the wet processing in this way.

Further, in the embodiments above, although the processing liquid continues to be released from the processing space (the gap space S1 or the storage space S3) while the wet processing is performed, this is not limiting. The wet processing may by performed to the substrate W while the processing liquid is kept in the processing space, and the processing liquid may be released from the processing space via the releasing portion after the wet processing is completed.

This invention is applicable to a substrate processing apparatus and a substrate processing method which perform a predetermined wet processing by supplying the processing liquid to a substrate in general including semiconductor wafers, glass substrates for photomask, glass substrates for liquid crystal display, glass substrates for plasma display, substrates for FED (field emission display), substrates for optical disks, substrates for magnetic disks, and substrates for magnet-optical disks.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
   a processing unit that includes a processing space in which a substrate is arranged, sequentially supplies mutually different plural kinds of processing liquid to the processing space to perform a predetermined wet processing to the substrate with respect to each processing liquid, releases the processing liquid used in the wet processing from a releasing portion downwards of the processing space in a predetermined direction upon each execution of the wet processing;
   a liquid retrieval unit that includes plural liquid retrievers, is separated from the processing unit, and is disposed below the processing unit, the plural liquid retrievers retrieving the plural kinds of processing liquid sequentially released from the releasing portion at each retrieval position predetermined with respect to each kind of the processing liquid; and
   a selective positioning unit that relatively moves the processing unit and the liquid retrieval unit to selectively position each of the liquid retrievers at each retrieval position corresponding to the kind of the processing liquid released from the releasing portion;
   wherein the liquid retrieval unit is moved in a horizontal direction by the selective positioning unit to the retrieval position corresponding to the kind of the processing liquid released from the releasing portion.

2. The substrate processing apparatus of claim 1, wherein the processing liquid is released from the releasing portion downwards vertically, and
   the selective positioning unit positions the liquid retriever at the retrieval position corresponding to the kind of the processing liquid released downwards vertically from the releasing portion.

3. The substrate processing apparatus of claim 1, wherein the releasing portion is singularly provided at a lower end of the processing unit.

4. The substrate processing apparatus of claim 1, wherein each of the plural liquid retrievers includes a retrieval space therein for retrieving the processing liquid, and
   the selective positioning unit positions the releasing portion inside the retrieval space prior to the release of the processing liquid from the releasing portion.

5. The substrate processing apparatus of claim 1, wherein each of the plural liquid retrievers is formed in a shape of a box, and the respective liquid retrievers are arranged adjacent to each other in a horizontal direction.

6. The substrate processing apparatus of claim 5, wherein each of the processing unit and the plural liquid retrievers is formed in a shape of a flat box, and
   the plural liquid retrievers are arranged such that a short side of each of the liquid retrievers is aligned in a direction which a short side of the processing unit extends.

7. The substrate processing apparatus of claim 5, wherein the liquid retrieval unit includes three retrieval tanks and a waste tank as the plural liquid retrievers which are arranged adjacent to each other in an order of the retrieval tank, the retrieval tank, the waste tank and the retrieval tank.

8. The substrate processing apparatus of claim 7, wherein a chemical solution and a rinsing liquid are supplied as the processing liquid, the chemical solution is retrieved in the retrieval tank, and the rinsing liquid is retrieved in the waste tank.

9. A substrate processing method comprising the steps of:
   arranging a substrate in a processing space provided in a processing unit;
   sequentially supplying mutually different plural kinds of processing liquid to the processing space to perform a predetermined wet processing to the substrate with respect to each processing liquid;
   releasing the processing liquid used in the wet processing from a releasing portion provided in the processing unit downwards of the processing space in a predetermined direction upon each execution of the wet processing;
   relatively moving the processing unit and a liquid retrieval unit that includes plural liquid retrievers, is separated from the processing unit, and is arranged below the processing unit to selectively position each of the liquid retrievers at a predetermined retrieval position corresponding to the kind of the processing liquid released from the releasing portion, wherein
   each of the plural liquid retrievers retrieves each of the plural kinds of processing liquid released sequentially from the releasing portion at each retrieval position with respect to each kind of the processing liquid;
   wherein the liquid retrieval unit is moved in a horizontal direction to the retrieval position corresponding to the kind of the processing liquid released from the releasing portion in the step of relatively moving the processing unit and the liquid retrieval unit.

10. The substrate processing method of claim 9, wherein a chemical solution and a rinsing liquid are supplied as the processing liquid in the step of sequentially supplying the processing liquid, the liquid retrieval unit includes three retrieval tanks and a waste tank as the plural liquid retrievers which are arranged in a horizontal direction adjacent to each other in an order of the retrieval tank, the retrieval tank, the waste tank and the retrieval tank, the chemical solution is retrieved in the retrieval tank, and the rinsing liquid is retrieved in the waste tank.

11. The substrate processing method of claim 9, wherein the processing liquid is released from the releasing portion downwards vertically, and the selective positioning unit positions the liquid retriever at the retrieval position corresponding to the kind of the processing liquid released downwards vertically from the releasing portion.

12. The substrate processing method of claim 9, wherein each of the plural liquid retrievers includes a retrieval space therein for retrieving the processing liquid, and the selective positioning unit positions the releasing portion inside the retrieval space prior to the release of the processing liquid from the releasing portion.

* * * * *